(12) United States Patent
Kuchibhotla

(10) Patent No.: US 6,774,983 B2
(45) Date of Patent: Aug. 10, 2004

(54) DISTRIBUTED PROJECTION SYSTEM

(75) Inventor: Sivarama K. Kuchibhotla, Lake Mohegan, NY (US)

(73) Assignee: Anvik Corporation, Hawthorne, NY (US)

( * ) Notice: Subject to any disclaimer, the term of this patent is extended or adjusted under 35 U.S.C. 154(b) by 10 days.

(21) Appl. No.: 10/217,356

(22) Filed: Aug. 12, 2002

(65) Prior Publication Data

US 2004/0027550 A1 Feb. 12, 2004

(51) Int. Cl.$^7$ ........................ G03B 27/42; G03B 27/70; G03B 27/54; G03B 27/72
(52) U.S. Cl. ........................ 355/67; 355/53; 355/66; 355/71
(58) Field of Search ................ 355/53, 66, 67, 355/71

(56) References Cited

U.S. PATENT DOCUMENTS

| | | | | |
|---|---|---|---|---|
| 3,819,265 A | * | 6/1974 | Feldman et al. | 355/51 |
| 5,285,236 A | * | 2/1994 | Jain | 355/53 |
| 5,291,240 A | * | 3/1994 | Jain | 355/53 |
| 5,652,645 A | * | 7/1997 | Jain | 355/53 |
| 5,710,619 A | * | 1/1998 | Jain et al. | 355/50 |
| 5,721,606 A | * | 2/1998 | Jain | 355/53 |
| 5,923,403 A | * | 7/1999 | Jain | 355/26 |
| 6,304,316 B1 | * | 10/2001 | Jain et al. | 355/53 |
| 6,416,908 B1 | * | 7/2002 | Klosner et al. | 430/5 |
| 6,445,442 B2 | * | 9/2002 | Von Bunau et al. | 355/67 |

* cited by examiner

Primary Examiner—Rodney Fuller
(74) Attorney, Agent, or Firm—Carl C. Kling

(57) ABSTRACT

Single-stage projection systems typically have a twice-folded optical path, with mask leg, crossover, 1:1 projection lens system, and substrate leg. They offer seamless patterning of large microlithographic substrates by overlapping complementary small-field scanning. A reverser maintains mask/substrate pattern congruence despite optical reversal, but presents the requirement of large working distance to permit access to the scanning stage. The required working distance demands large-diameter lens elements which are expensive in materials, grinding and assembly. A high-resolution 1:1 projection lens, for high-fluence laser light, adds extreme expense. Dividing the projection lens into two distributed-part-lenses, in mask and substrate legs, maintains satisfactory working distance, minimizes lens diameter requirements, and thus cuts cost. The aperture stop is positioned at the midpoint of the optical path, preferably at the time of manufacture, by an auxiliary stage. The aperture stop is physically asymmetrical because of the optical path length inherent in the reverser.

18 Claims, 4 Drawing Sheets

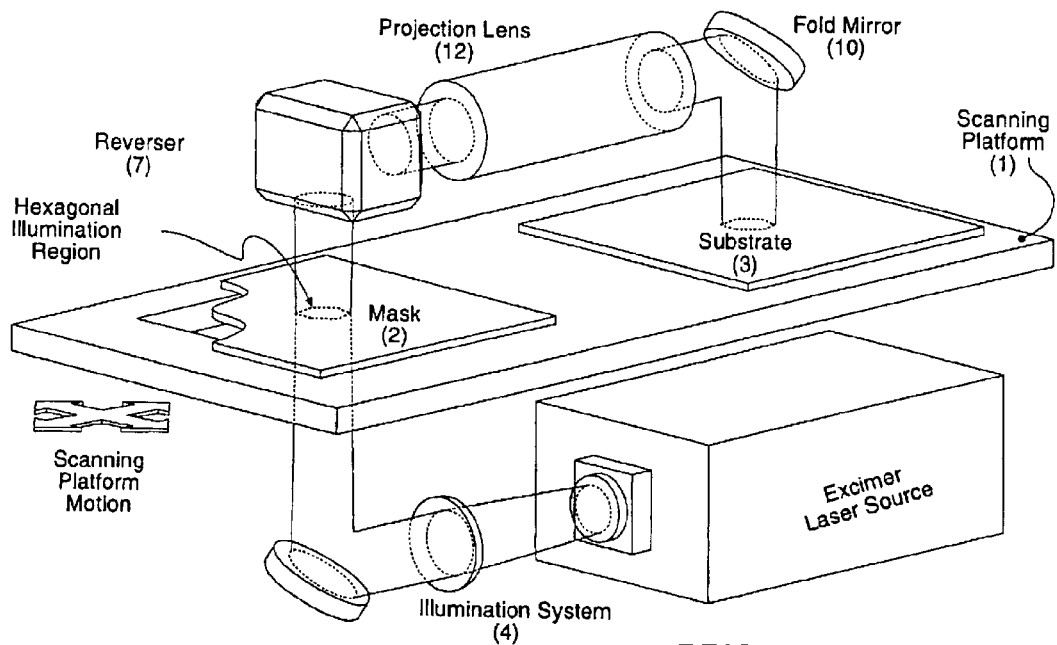
PRIOR ART Fig. 2
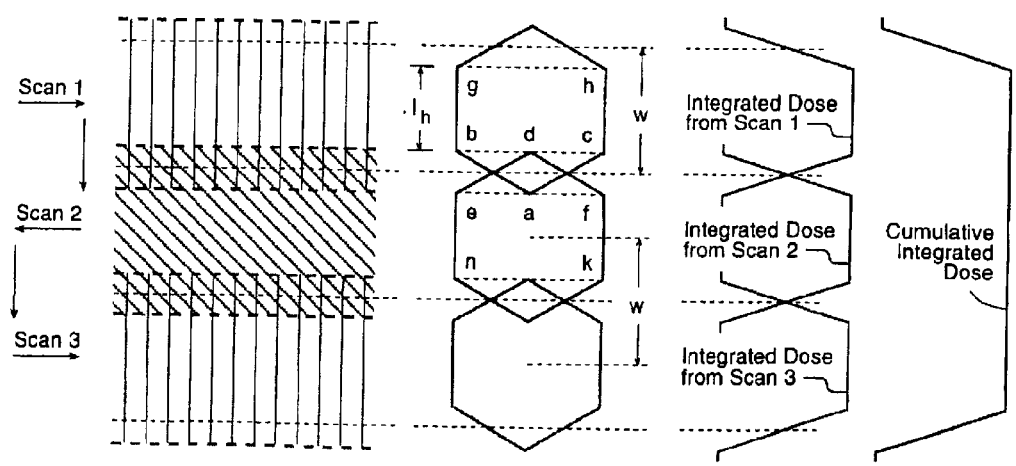
PRIOR ART Fig. 3

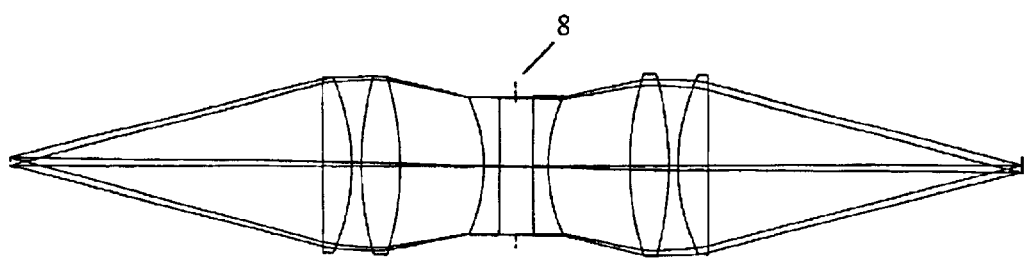
PRIOR ART  Fig. 4
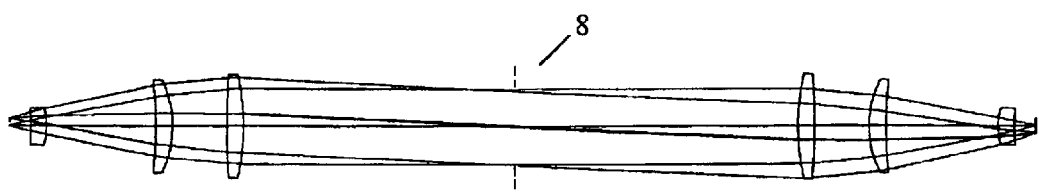
Fig. 5

DISTRIBUTED PROJECTION SYSTEM

CROSS-REFERENCE TO RELATED APPLICATIONS

None

(C) STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

(1) Field of the Invention

This invention relates to projection systems for microelectronics patterning, of the type having a mask leg, crossover with an aperture stop, and a substrate section, for projecting microelectronics patterns onto substrates, and particularly relates to a technique for maintaining the required numerical aperture and working distance, and for minimizing the lens diameter size requirements, by distributing optical elements respectively in mask section, crossover and substrate section, positioning the aperture stop to balance the optical path lengths of mask section to aperture stop and substrate section to aperture stop.

(2) Description of Related Art

The dramatic decrease in cost coupled with the equally dramatic increases in performance, throughput, yield and cost reduction in the electronics industry are attributable in large part to several innovations in the field of optical microlithography. Key factors like speed and performance of the chips, their associated packages and hence the computer systems are dictated by the minimum printable size offered by lithography.

A typical lithographic system includes exposure tool, mask, resist, and all of the processing steps to accomplish pattern transfer from a mask to a resist and then to devices.

Many types of exposure tools are currently used in the fabrication of electronic modules; these include contact and proximity printers, single-field projection imaging systems, step-and-repeat tools, scanning projection printers, and focused-beam direct-write systems. All existing lithography tools suffer from significant limitations, including one or more of the following disadvantages: defect generation on the substrate, mask life degradation, limited substrate size capability, limited resolution, low throughput, stitching errors, poor yield, high system cost, poor opto-mechanical performance, and inability to drill vias in batch mode.

Many of these disadvantages are minimized by prior art Anvik technique of overlapping hexagonal-seamless scanning of mask to substrate on a single-planar stage. This system configuration provides both high optical and scanning efficiencies, and combines high-resolution imaging with very large exposure area capability.

FIGS. 1 & 2—Single-Stage Seamless Scanning

FIG. 1 shows the invention in a context including much of the prior art Anvik technique as shown in perspective in FIG. 2. It uses the same complementary hexagonal overlapping scans and the same single-stage presentation of mask and substrate for locked alignment of mask to substrate in a large area patterning system. The major difference is that the prior art does not show the distributed configuration of the projection optics, nor the aperture stop physically positioned assymmetrically in the crossover to maintain optical symmetry in the projection system despite the optical path length increase inherent in the reverser.

FIG. 2 schematically illustrates a large-area, scan-and-repeat lithography system incorporating a prior art Anvik technique. The substrate and mask are fixedly mounted on the same platform of a single stage. The stage is capable of moving the substrate and mask in synchronism in both x- and y-directions. The illumination system, having an excimer laser light source, is such that its effective emission plane is in the shape of a regular hexagon, which is imaged by a condenser at the mask. A 1:1 projection lens images the pattern contained within the illuminated hexagonal region on the mask onto the substrate. A reversing unit ensures that the image is in the same orientation as the object.

The lens has a numerical aperture NA, determined by the required resolution. NA denotes the numerical aperture at the mask on the illumination side, and is determined by partial coherence considerations. The largest regular hexagon that can be inscribed within the circular image field of the lens is used as the corresponding exposure region on the substrate.

The single-planar stage allows the mask and substrate to scan in unison (say, along the x-axis) across their respective illumination regions to traverse the substrate length. Following a scan, the stage moves along y by an amount which we call the effective scan width (shown as w in FIG. 3). Now the substrate and mask are again scanned along x as before, after which they are again laterally moved along y, and the process is repeated until the entire substrate is exposed. The complementary overlap between adjacent hexagonal scans is such that the transition, from one scan to the next, is totally seamless and free from any exposure non-uniformity.

This high-throughput, high-resolution patterning in photoresists and via-generation capabilities, the Anvik lithography system technology, is highly attractive for patterning applications in high-volume fabrication of a broad range of large-format electronic products, including flat-panel displays, multi-chip modules, and printed circuit boards.

However, the important requirement of long conjugate lengths, to accommodate the reversing and folding devices in the path, have in the prior art limited the single-stage imaging system to moderate-NA optical subsystems with moderate field of view. The requirement of long conjugate distances severely impacts the design and the overall cost of an imaging system, especially while targeted toward systems with high-resolution and high-NA, by requiring very large, and thus very expensive, lenses.

Conventional imaging systems, using a dual-stage technique and separate mask and substrate scanning systems, differ in their working distances set by their conjugate distances.

In single-stage Anvik seamless scanning technology, the desire is to have large conjugate distances of the projection lens to comfortably accommodate the reverser and folding devices within the imaging system for single stage operation. This may not pose a serious challenge for moderate-NA projection lenses. Higher-NA projection lenses, if they were to have large conjugate distances, would make the lens element sizes very large. Large lens size would significantly affect the design time and effort to control some aperture-dependent aberrations like spherical aberration and coma. This cost increase is far from linear; large lenses increment cost over smaller lenses approximately by the cube as size doubles. There are other problems with increased lens size in the special lenses for high-fluence ultra-violet radiation such as is preferred for microelectronics image patterning. Consequently, this would substantially increase the cost of manufacturing and building such a huge lens system due to the inevitable tight tolerances. In the context of single-stage scanning imaging systems, any system with NA≧0.25 may be considered as a high-NA system as the requirement of long conjugate length would start influencing the basic configuration of the imaging system. In addition, as mentioned earlier, the requirement of large conjugate length at high-NA can significantly affect the design and configuration of the projection lens.

History presented several configurations to projection systems that are widely used in the field of optical lithography. They are broadly classified as all-reflective, catadioptric and all-refractive types and the choice of their selection is truly guided by factors like material availability at operating wavelengths, resolution and depth of field (DOF) of the system, projection technique and cost of ownership. Single-stage scanning systems offer high potential for large-pattern lithography in future systems. However, the maximum NA and thus the minimum feature size of these single-stage scanning systems are usually limited as discussed above.

Single-stage 1:1 projection subsystems typically have a twice-folded optical path, with a mask section, crossover, and a substrate section. They offer seamless patterning of large microlithographic substrates, by overlapping complementary small-field scanning. A reverser compensates for optical reversal to maintain mask/substrate pattern congruence, but presents the problem of additional optical path length. A 1:1 projection lens, which must pass high-fluence laser light, adds another problem, high expense, particularly when desire for a larger field size and higher resolution suggests a larger numeric aperture (NA). The mask and substrate sections, even though vacant in prior art subsystems, have finite lengths to permit access to the scanning stage, and thus may add to the conjugate length.

SUMMARY OF THE INVENTION

The invention distributes the projection system over two partial lenses, in mask and substrate sections, and shortens the crossover, minimizing total optical path length, but locates the aperture stop in the crossover, remote from at least one of the distributed part-lenses. The aperture stop is positioned by means such as an auxiliary stage, physically asymmetrical between the two partial lenses, to balance the extra optical distance inherent in the reverser.

It is the object of the invention to minimize lens aberrations, size and cost, by distributing the projection system so as to permit significantly smaller-diameter lens elements and thus to minimize problems of cost, optical path length and manufacturing difficulty in a twice-folded optical projection system.

Another object of the invention to minimize the optical path length in a twice-folded projection system having a reverser.

Still another object of the invention is to provide working distance, including space for optical elements, without adversely extending conjugate distances.

A feature of the invention is the distributed location of the projection system as two part-lenses, located remote from each other in the vertical sections of the twice-folded projection system, with the aperture stop positioned physically asymmetrical but optically symmetrical to compensate for the added optical path length inherent in the reverser.

Another feature of the invention is the use of an auxiliary stage to relocate the aperture stop to compensate for the added optical path length inherent in the reverser.

An advantage of the invention is the optimized optical path length made possible by dividing the projection system into two distributed-part-lenses and locating them respectively in the vertical mask section and in the vertical substrate section.

Another advantage of the invention is the cost savings involved in having distributed-part-lenses rather than in having a single projection lens, each of the distributed part-lenses costing significantly less than half the cost of a single projection lens while providing other advantages including shortened optical path length and lowered system and replacement parts costs.

Still another advantage of the invention is that it continues to solve optical problems in projection patterning of microelectronics on large substrates, while permitting a diminished footprint in the extremely expensive environment of the clean room while at the same time lowering the cost of the projection system.

Other objects, features and advantages of the invention will be apparent to those skilled in the art, in light of the attached drawings and written description of a preferred embodiment.

BRIEF DESCRIPTION OF DRAWINGS

FIG. 2 is a semi-diagrammatic view of a typical PRIOR ART folded-projection system for single-stage presentation of mask and substrate.

FIG. 3 is an operation diagram of PRIOR ART complementary overlapping hexagonal scans providing a uniform cumulative integrated dose of illumination across the substrate in a typical PRIOR ART folded-projection system.

FIG. 4 is a diagram of a PRIOR ART projection lens shown for explanation.

FIG. 5 is a semi-schematic optical diagram of an unfolded projection lens system with distributed-part-lenses separated from the aperture stop. At small working distances, the lens element diameter will be significantly smaller than those shown in prior art.

DETAILED DESCRIPTION OF PREFERRED EMBODIMENT

Figure 1:
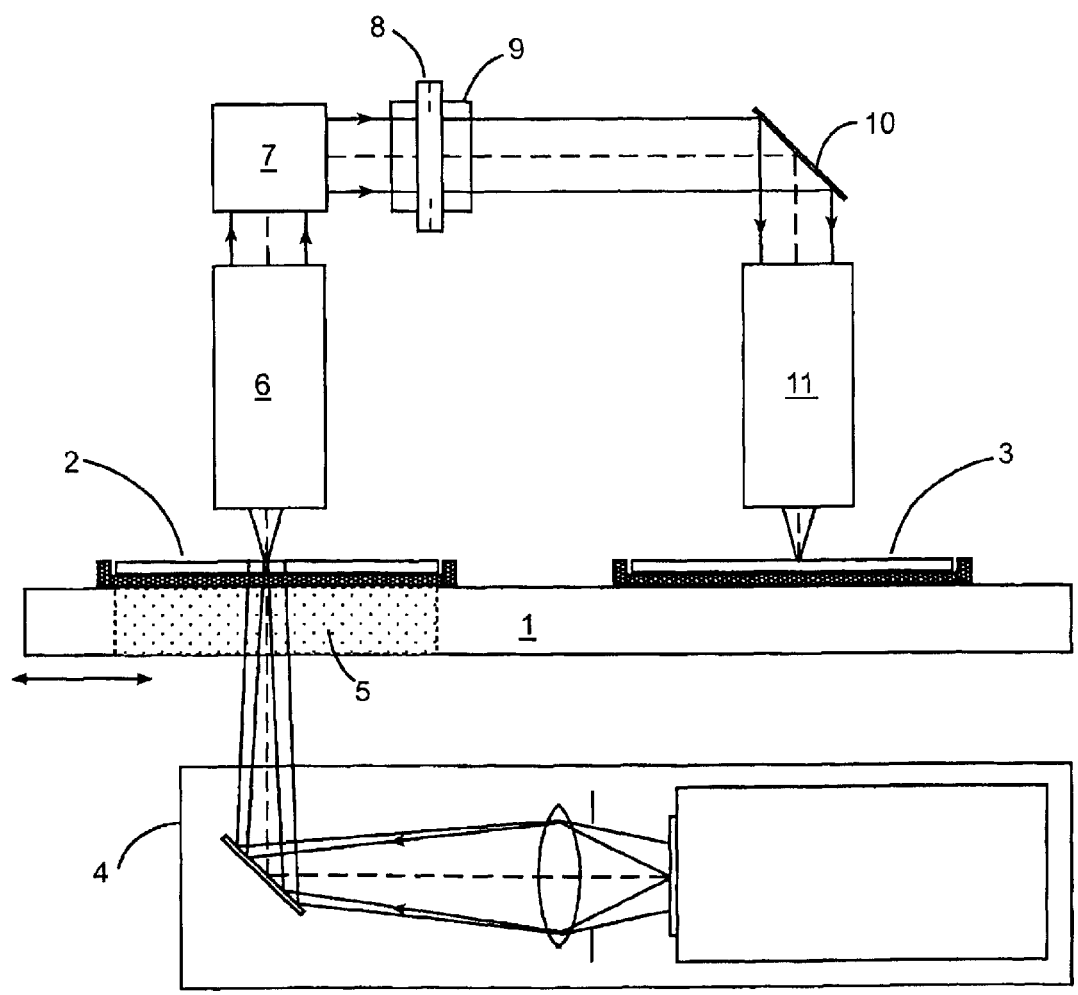
FIG. 1 is a simplified sketch of a system according to the invention

FIG. 1—Diagram of Embodiment

FIG. 1 shows stage 1 with mask 2 and substrate 3 for simultaneous scanning. Mask 2 and substrate 3 move synchronously, with their congruency during scanning ensured by being locked onto the platform of stage 1. Laser illumination system 4 supplies pulses of light which are treated by an included homogenizer so as to be self-luminous. The light beams pass through window 5 in stage 1, and also pass selectively through mask 2, to part-lens 6 which constitutes the mask section. The patterned light beam passes to reverser 7. Reverser 7 adds optical path length as the mask pattern is reversed and redirected, at a right angle, to the aperture stop 8 in the crossover section as indicated by dotted box 9. The patterned beam, already reversed, passes via fold mirror 10 to the other half of the projection distributed lens, part-lens 11 and the surface of substrate 3.

Note that aperture stop 8 is physically asymmetrical in the crossover. The reason for the physical asymmetry is to make it optically symmetrical. It must balance the optical path length from part-lens 6 to part-lens 11, compensating for extra optical path length inherent in reverser 7.

FIG. 2—Single-Stage Folded Projection—Prior Art

A typical prior art seamless scanning projection system is mounted above the stage, in the crossover, with its axis lying in a plane parallel to the plane of the stage. The mask section is vacant of optical elements, as is the substrate section, but each has a finite length for clearance, adding to the total optical path. Reverser 7 is similar to reverser 7 in FIG. 1, and has the same function, as do other numbered items. The most significant difference is that the projection system 12 in FIG. 2 is in a single unit, rather than being distributed in three units as in FIG. 1 (negative front-end part-lens/aperture stop/positive rear-end part-lens).

FIG. 3—Overlapping Complementary Hexagonal Seamless Scanning—Prior Art

The desire for uniform dosage of light during scanning is met by complementary overlap of adjacent scans. FIG. 3 shows three overlapping scans with a field of hexagonal shape. The overlapping hexagon points of adjacent scans provide diminishing dosages toward the point, with these diminishing dosages being opposite so as to be complementary in integrated dosage, as shown by the shape of the Cumulative Integrated Dose as shown.

FIG. 4—Typical Projection Lens—Prior Art

FIG. 4 shows a typical projection lens, with a negative set of numerous elements grouped on one side of aperture stop 8 to complements positive set on the other side.

FIG. 5—Unfolded Distributed Projection System

FIG. 5 is a semi-schematic optical diagram of an unfolded projection system with distributed-part-lenses separated from the aperture stop. At small working distances, the lens element diameter will be significantly smaller than those shown in prior art.

Figure 6:
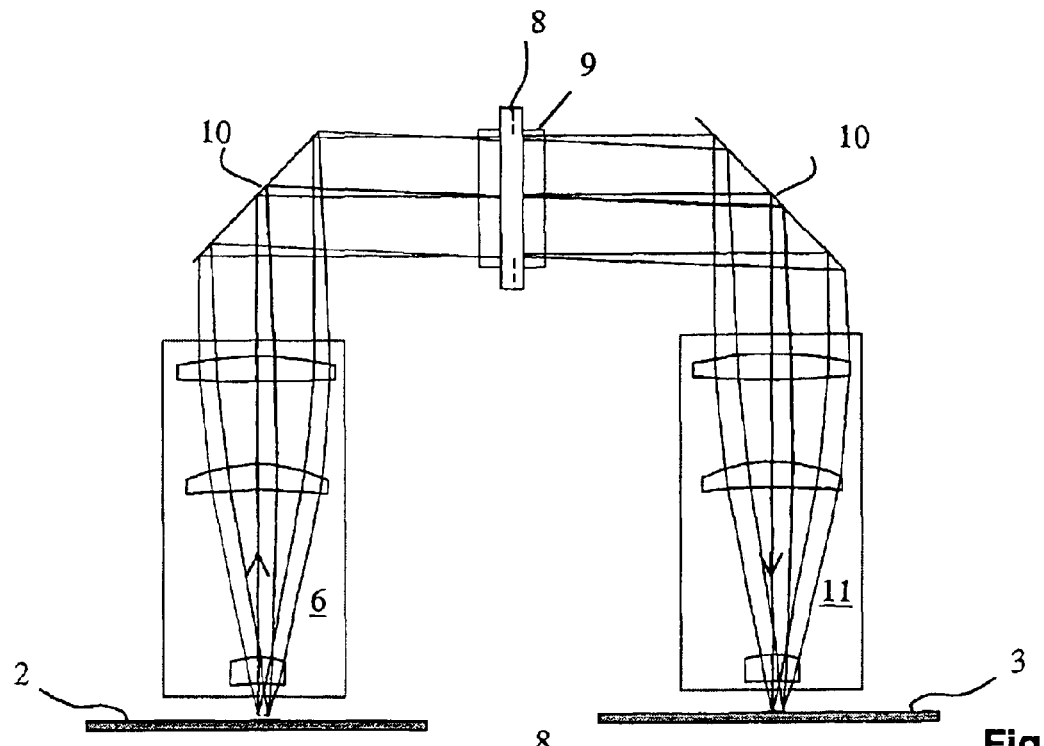
FIG. 6 is a semi-schematic optical diagram of an unfolded projection system with distributed-part-lenses separated from the aperture stop. At small working distances, the element diameters will be significantly smaller than shown in PRIOR ART.

FIG. 6—Folded Projection System with Distributed-Part-Lenses but without Reverser FIG. 6 is a semi-schematic optical diagram, for discussion only, of a folded projection system with distributed part-lenses in the sections and the aperture stop physically centered. There is no reverser. Aperture stop 8 is symmetrically located both physically and optically. It is midway between part-lenses 6 and 11 in FIG. 1. The omission of the reverser, however, would greatly limit the use of seamless scanning techniques in patterning large substrates.

Figure 7:
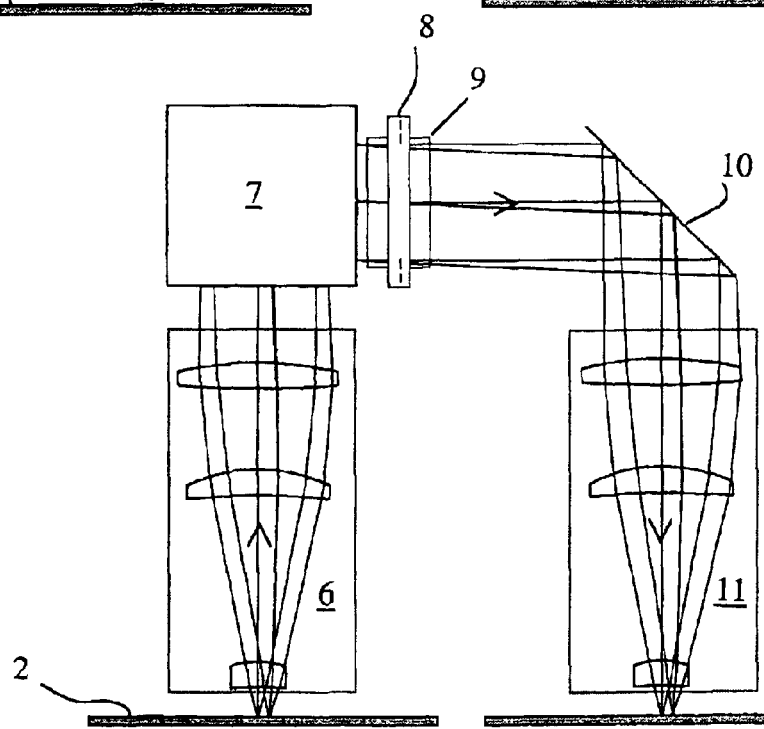
FIG. 7 is a semi-schematic optical diagram of a folded projection system with distributed part-lenses in the sections and with a reverser connecting mask section to crossover, showing the aperture stop physically asymmetrical as a result of adjusting for optical path length symmetry considering the added optical path length inherent in the reverser, so as to present as its output an exact image.

FIG. 7—Folded Projection System with Distributed-Part-Lenses and With Reverser

FIG. 6 is a semi-schematic optical diagram of a folded projection system with distribute parts in the sections and with a reverser connecting mask section to crossover. The aperture stop 8 is physically asymmetrical as a result of adjusting for optical path length symmetry considering the added optical path length inherent in the reverser.

Alternative Details With Preferred Embodiments

Aperture stop 8 is positioned symmetrically with respect to the light path from part-lens 6 to part-lens 11. Folding of the optical path within the reverser 7 might cause an uncertainty in placing the aperture stop 8 precisely half-way between distributed half lenses to balance the optical path of unit magnification system. Environmental factors may make small differences in the required physical placement of aperture stop 8 to achieve a balanced optical path about the aperture stop 8. It is preferred to have aperture stop 8 mounted on a dedicated auxiliary stage 9. The auxiliary stage assists precise placement of the aperture stop between reverser and fold mirror during projection lens buildup.

A compact, high-speed and high-resolution twice-folded distributed-projection configuration, for a single-stage scanning exposure system, may find uses without the 1:1 lens with its need for a reverser. The distributed projection system might directly serve these needs, with an aperture stop positioned during manufacturing. Economic considerations may make it advantageous not only to use the distributed projection technique, but even to use the small auxiliary stage 9 for repositioning the aperture stop 8. This may be a one-time positioning during manufacture, but may find additional usage during testing of the projection lens. It also may simply be a low-cost expedient to minimize machining cost of the lens barrel in high-resolution lenses.

The distributed projection system may also be used with a projection lens not exactly 1:1, for correction of temperature-related unbalanced expansion, or where stage-on-stage or other dual-stage techniques permit magnification or demagnification.

Discussion of Design Considerations

The lithographic projection lenses are typically designed for diffraction-limited performance. The specific intention for this invention was to design a high-resolution projection lens for single-planar stage, seamless scanning system, with the following specifications:

| | |
|---|---|
| Resolution | 1 microm |
| Projection system | 1:1 magnification refractive lens |
| Numerical aperture | 0.25 $\mu$m |
| Depth of focus | 5.6 $\mu$ms |
| Field diameter | 10 mm |
| Exposure source | XeF excimer laser |
| Wavelength | 351–354 nm |
| Imaging technique | Single-planar stage seamless scanning technique |
| Special requirement | Large working distance to accommodate the reverser system |

Aspects of both inverse telephoto and double-gauss lenses were considered, to produce a large working distance, large-NA lens with a large field-of-view. In either of these basic configurations, the requirements of large working distance and large NA cause the overall element to become too large, and to pose a real challenge to correct spherical aberration and coma in the system. A field-of-view of 10 mm, though not a big challenge to either of these unit magnification symmetrical configurations, resulted in a high NA system with large element sizes. These large elements sizes would introduce off-axis pupil aberrations in addition to spherical aberrations, making system performance correction very complicated.

An alternative configuration that is part of this invention has been developed for such an imaging system that can offer full field-of-view of 10 mm with small element and beam sizes leaving scope for a very compact imaging system.

The design of a less-expensive solution for relatively high-NA projection systems working under the seamless Anvik scanning technique is guided by the fact that the size of the projection lens elements can be kept small only by reducing the working distance, and that separating the two halves of such a unit magnification system to a long distance on either side of the aperture stop does not disturb the merits of a symmetrical unit magnification system. An unfolded system of such a lens configuration has a dumbbell shape with large beam track in between the two identical halves having short conjugate length This allows placing each half lens in one of the vertical columns of the single-stage imaging system. Each half lens can have small element sizes working at small working distance. The aperture stop can be mounted on a translation stage that can be very precisely aligned and placed to control the symmetric aberrations.

The configuration was laid out initially for small field-of-view and reasonably large lens-to-aperture stop distance so that the reverser and fold mirror can be accommodated in this distance on either side of the aperture stop. The field-of-view and the reverser path lengths are progressively extended later to fulfill all the design and performance requirements as described below.

FIG. 1 illustrates the configuration suitable to a single-stage imaging system, with the two halves of the lens and the long intermediate distance utilized by the reverser and the fold mirror for folding onto the horizontal axis. While the aperture stop is physically equidistant from each half of the lens system, it is nearer to the reverser unit due to the extra beam path within the reverser. The design now follows the principles of infinity-corrected microscope objective and uses $CaF_2$ for positive powered elements and fused silica for negative powered elements. The following table quantifies the merits of this distributed-configuration over the prior art configuration discussed earlier.

| Property | Prior Art configuration | Distributed projection lens configuration |
|---|---|---|
| Full field-of-view | 6 mm | 10 mm |
| Maximum lens diameter | 160 mm | <80 mm |
| # of elements | 18 | 16 |
| Overall length | ≦600 mm | Not applicable |
| Lens-aperture distance | Not applicable | <250 mm |
| Working distance | 250 mm | 15 mm |
| Performance | Requires further correction | Fully corrected for superior performance |

The significant advantages of the distributed-system configuration over the conventional configuration are the large field of view, smaller element size, smaller number of elements and superior performance. In addition, the reverser and fold mirror units, being part of the imaging system, are smaller in size due to smaller beam sizes that would make the whole imaging system relatively much more compact and less expensive. The horizontal separation between the two vertical columns separating mask and substrate is 8.5 in, making possible to work with all nominal sized wafers In other words, the larger the separation between the two identical halves of the projection system, the larger the size of the substrates to work with.

Conclusions

While the invention has been shown and described with respect to a folded distributed projection system with 1:1 projection of mask pattern onto substrate sharing a stage for complementary seamless scanning, it will be clear to those familiar with the art to make the above and other changes without departing from the spirit and scope of the invention.

The distributed-system configuration presented in this patent application opens up new possibilities for compact, high-resolution optical lithography. Other applications, such as where large-distance image relay with arbitrary magnifications other than 1:1 are to be carried out, may benefit from the large space between the two portions of the projection lens. This large space gives an opportunity to fold the optical path and make the imaging system very compact. The distributed configuration also permits a large-NA optical system to be implemented with smaller-diameter lens elements, at great savings in both lens cost and system cost, because lens cost decreases dramatically as lens element diameter is decreased, and because the system size and weight can also decrease as the lens size decreases.

What is claimed is:

1. A distributed projection system for a mask projection patterning system in which a unitary stage carries both mask and substrate, mounted for simultaneous scanning motions, in which the projection system is substantially 1:1 with a reverser, characterized in that:
 a) the projection system is of finite length and is twice folded with mask part-lens section, with crossover section with aperture stop, and with substrate part-lens section;
 b) said crossover section is in two part-sections, the reverser part-section and the natural part-section, with an intermediate aperture stop position, the reverser part-section having additional optical path length inherent in said reverser; and
 c) said aperture stop position is positioned to balance the optical path lengths of the reverser half-section and the natural half-section.

2. A distributed projection system according to claim 1 further characterized in that:
 said crossover section is mounted so as to be essentially in a plane parallel to the plane of said unitary stage.

3. A distributed projection system according to claim 1, further characterized in that:
 said crossover section includes means to move said aperture stop position for balancing the optical path length differences caused by said reverser and possible lens element deviations from perfect symmetry.

4. A distributed projection system according to claim 3, further characterized in that:
 said means for repositioning said aperture stop to achieve the desired length of the optical path on each side of said aperture stop is a precision stage.

5. A distributed projection system according to claim 1, further characterized in that:
 said mask part-lens subsection and said substrate part-lens subsection are each mounted vertically with respect to the stage platform horizontal.

6. A distributed projection system according to claim 5, further characterized in that:
 said mask part-lens subsection and said substrate part-lens subsection are each of improved configuration of infinity-corrected microscope objective.

7. A distributed projection system according to claim 3, further characterized in that:

said mask part-lens and said substrate part-lens are optically identical and are mounted oppositely, for compensation of aberrations in unit magnification.

8. A distributed projection system according to claim 7, further characterized in that:

positive powered elements are of a first material and negative powered elements are of a second material having a complementary thermal index variations with respect to that of said first material.

9. A distributed projection system according to claim 8, further characterized in that:

positive powered elements are of calcium fluoride and negative powered elements are of fused silica.

10. A folded distributed projection system characterized by:

a first part-lens and second part-lens that are mirror images, so they are positionable for a resulting substantially 1:1 magnification with minimal aberration;

a crossover section separating said first and second pad-lenses, having an intermediately-positioned aperture stop and having on one side of said aperture stop an optical element with inherent optical path length; and means for positioning said aperture stop at the desired length of the optical path on each side of said aperture stop position.

11. A distributed projection system according to claim 10, further characterized in that said means for repositioning said aperture stop to achieve the desired length of the optical path on each side of said aperture stop is an auxiliary stage.

12. A distributed projection system characterized by:

a first part-lens and second part-lens that are non-identical, and are positionable across a crossover section for a desired magnification with minimal aberration and with the desired conjugate length;

a crossover section separating said first and second part-lenses, having an intermediately-positioned aperture stop; and means for positioning said aperture stop at the desired length of the optical path on each side of said aperture stop position.

13. A distributed projection system according to claim 12, further characterized in that:

said means for repositioning said aperture stop to achieve the desired length of the optical path on each side of said aperture stop is a precision stage.

14. A distributed folded projection system for an object projection patterning system in which a stage subsystem carries object plane and image plane, mounted for simultaneous magnification-related scanning motions, in which the magnification differs significantly from 1:1, has inverting properties and has different optical path lengths on differing sides of the aperture stop characterized in that:

a) the projection system is of finite length and is folded with object partial-lens section, with crossover section with aperture stop, and with image partial-lens section;

b) said crossover section is in two part-sections, the long part-section and the short part-section, with an intermediate aperture stop;

c) said stage subsystem provides for simultaneous magnification-related scanning motions respectively of object plane and image plane; and d) said crossover section has means to locate said aperture stop position to balance the optical path length requirements of the long half-section and the short half-section and has means to mount folding elements with sufficient working distance.

15. A distributed projection system characterized by a) a first lens barrel, having optical elements, on the object side;

b) a second lens barrel, having optical elements, on the image side;

c) a crossover between said first lens barrel and said second lens barrel; and d) an aperture stop far from the first and second lens barrels in said crossover whereby size of optical elements and related costs are significantly reduced while performance is enhanced as contrasted to a unitary projection system with the same numerical aperture for the same object and image.

16. A distributed projection system according to claim 15 further characterized in that e) said crossover is perpendicular to said first and second lens barrels, with intervening folding elements.

17. A distributed projection system according to claim 16 further characterized in that f) said aperture stop is located in said crossover.

18. A distributed projection system according to claim 17 further characterized in that f) one of said folding elements is a reverser, and said aperture stop is located in said crossover at a point physically asymmetrical but optically symmetrical considering the optical path length of said reverser.

* * * * *